United States Patent
Lin et al.

(10) Patent No.: US 8,450,801 B2
(45) Date of Patent: May 28, 2013

(54) LATERAL-DIFFUSION METAL-OXIDE-SEMICONDUCTOR DEVICE

(75) Inventors: Hong-Ze Lin, Hsinchu (TW); Bo-Jui Huang, Hsinchu (TW); Chin-Lung Chen, Hsinchu County (TW); Ting-Zhou Yan, Kaohsiung County (TW); Wei-Shan Liao, Yunlin County (TW); Han-Min Huang, Taipei County (TW); Chun-Yao Lee, Taipei County (TW); Kun-Yi Chou, Taipei County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 280 days.

(21) Appl. No.: 12/869,764

(22) Filed: Aug. 27, 2010

(65) Prior Publication Data

US 2012/0049277 A1    Mar. 1, 2012

(51) Int. Cl.
*H01L 23/62*    (2006.01)

(52) U.S. Cl.
USPC .......................................................... 257/336

(58) Field of Classification Search
USPC .......................................... 257/335, 336, 341
See application file for complete search history.

(56) References Cited

U.S. PATENT DOCUMENTS

| | | | |
|---|---|---|---|
| 2005/0250263 A1* | 11/2005 | Liu et al. ........................ | 438/151 |
| 2006/0086973 A1* | 4/2006 | Hitani et al. ................... | 257/335 |
| 2010/0032758 A1 | 2/2010 | Wang | |
| 2010/0127326 A1* | 5/2010 | Lee ................................. | 257/336 |
| 2011/0079849 A1* | 4/2011 | Yan et al. ....................... | 257/343 |

* cited by examiner

*Primary Examiner* — Thomas L Dickey
(74) *Attorney, Agent, or Firm* — Winston Hsu; Scott Margo

(57) ABSTRACT

A lateral-diffusion metal-oxide-semiconductor device includes a semiconductor substrate having at least a field oxide layer, a gate having a layout pattern of a racetrack shape formed on the substrate, a common source formed in the semiconductor substrate and enclosed by the gate, and a drain surrounding the gate and formed in the semiconductor substrate. The gate covers a portion of the field oxide layer. The common source includes a first doped region having a first conductive type and a plurality of islanding second doped regions having a second conductive type. The drain includes a third doped region having the first conductive type. The third doped region overlaps a portion of the field oxide layer and having an overlapping area between the third doped region and the field oxide layer.

19 Claims, 6 Drawing Sheets

LATERAL-DIFFUSION METAL-OXIDE-SEMICONDUCTOR DEVICE

BACKGROUND OF THE INVENTION

1. Field of the Invention

The present invention relates generally to a lateral-diffusion metal-oxide-semiconductor (LDMOS) device, and more particularly, to a LDMOS device having low On-state resistance (Ron).

2. Description of the Prior Art

With the progress of semiconductor integrated circuits manufacturing, it is more preferable to have controllers, memories, devices for low-voltage operation and power devices for high-voltage operation integrated in one single-chip system. Therefore the prior art has employed the insulated gate bipolar transistor (IGBT) and double-diffused metal oxide semiconductor (DMOS) transistor devices as the power devices of high-voltage operation in the single-chip system.

The DMOS transistor device can be categorized into the lateral DMOS (LDMOS) device and the vertical DMOS (VDMOS) device. Having advantage of higher operational bandwidth, higher operational efficiency, and convenience to be integrated with other devices such as CMOS devices due to its planar structure, LDMOS devices are more widely used. Please refer to FIGS. 1-2, wherein FIG. 1 is a schematic drawing illustrating a layout pattern of a conventional LDMOS transistor device and FIG. 2 is a cross-sectional view taken along a crossing line A-A' in FIG. 1. As shown in FIGS. 1-2, the conventional LDMOS device 100 is a symmetric structure positioned on an N-type well 104 in a substrate 102. The LDMOS device 100 includes a gate 110 having a "Π" shape, a source 120 and a common drain 130. The source 120 includes a p-type doped region 122 having a high doping concentration and an N-type doped body 124 having a doping concentration formed in the p-type doped region 122. The common drain 130 is formed in a center area of the symmetric structure and includes a P-type doped region 132 having a high doping concentration. The gate 110 is positioned on a gate dielectric layer 112 and extends to a field oxide layer 114 that is formed by conventional local oxidation of silicon (LOCOS) method. Typically, another P-type doped region 116 having a high doping concentration is formed underneath the field oxide layer 116. In addition, it is well-known that a cell pitch of the conventional LDMOS device 100 is the length designated by the line A-A'.

Please refer to FIG. 3, which is a schematic drawing illustrating a portion of a layout pattern of a conventional source. The source 120a includes a P-type doped region 122a having a high doping concentration and an N-type doped body 124a having a high doping concentration positioned in the P-type doped region. As shown in FIG. 3, the N-type doped body 124a is a strip region formed in the P-type doped region 122a, therefore only two sides of the N-type doped body 124a contact with the P-type doped region 122a. Furthermore, butting contact 140 are usually used to electrically connect the P-type doped region 122a and the N-type doped body 124a that possess different conductive types to a same electrical potential. Therefore a width "a" of the stripe N-type doped body 124a, a distance "b" between the stripe N-type doped body 124a and the butting contact 140, and a distance "c" between the butting contact 140 and the gate 110 are always put in serious consideration when designing the circuit layout pattern. Accordingly, a distance "d" between any two parallel gates is a sum of the width "a" of the stripe N-type doped body 124a, the distance "2b" that represents the distances between the both sides of the N-type doped body 124a and the butting contact 140, and the distance "2c" that represents distances between the both sides of the butting contact 140 and the gate 110. As shown in FIG. 3, since the width "a", the distances "2b" and the distance "2c" are spatially parallel and each width and distance is limited by its own process window, it is impossible to reduce the distance "d" between the parallel gates 110 according to this circuit layout pattern. For example, in the conventional process window, the width "a" of the stripe N-type doped body 124a is 0.6 micrometer (μm), the distance "b" of between the stripe N-type doped body 124a and the butting contact 140 is 0.5 μm, and the distance "c" between the butting contact 140 and the gate 110 is 0.3 μm, accordingly the distance "d" between the parallel gates 110 cannot be smaller than 2.2 μm.

As mentioned above, because the LDMOS device 100 is a high-voltage device that requires an operating voltage in a range of 20-300 Volt (V), the prior art always demands the LDMOS device 100 having high breakdown voltage and low Ron. For instance, The LDMOS device 100 having an operating voltage of 40V has required to have the cell pitch of 11 μm, the breakdown voltage of 49.5 V, and the Ron of 270 mΩ/mm². It is well-known that due to the requirement of high breakdown voltage and the limitation of process window, the cell pitch of the LDMOS device 100 that horizontally formed on the substrate 102 cannot reduced as the single chip system keeps shrinking. Furthermore, such limitations is not only adverse to reduce the Ron but also adverse to the applicability of the LDMOS device 100.

SUMMARY OF THE INVENTION

According to a first aspect of the present invention, there is provided a lateral-diffusion metal-oxide-semiconductor (LDMOS) device. The LDMOS device comprises a semiconductor substrate having at least a field oxide layer formed thereon, a gate having a layout pattern of a racetrack shape positioned on the semiconductor substrate, a drain surrounding the gate formed in the semiconductor substrate, and a common source formed in the semiconductor substrate and enclosed by the gate. The gate covers a portion of the field oxide layer. The common source comprises a first doped region having a first conductive type and a plurality of islanding second doped regions having a second conductive type.

According to a second aspect of the present invention, there is provided a LDMOS device. The LDMOS comprises a semiconductor substrate having a deep well region formed therein and a field oxide layer formed thereon, a gate having a layout pattern of a racetrack shape positioned on the semiconductor substrate and overlapping a portion of the field oxide layer, a drain surrounding the gate and formed in the semiconductor substrate, and a common source formed in the semiconductor substrate and enclosed by the gate. The deep well region comprises a first conductive type. The drain comprises a first doped region having a second conductive type formed in the deep well region, the first doped region overlaps a portion of the field oxide layer and an overlapping area is formed therebetween.

According to the LDMOS transistor device, the common source having an optimal layout pattern is provided to reduce the cell pitch and the doped regions of the drain that provided surrounding the gate are used to reduce the Ron and simultaneously improve the breakdown voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
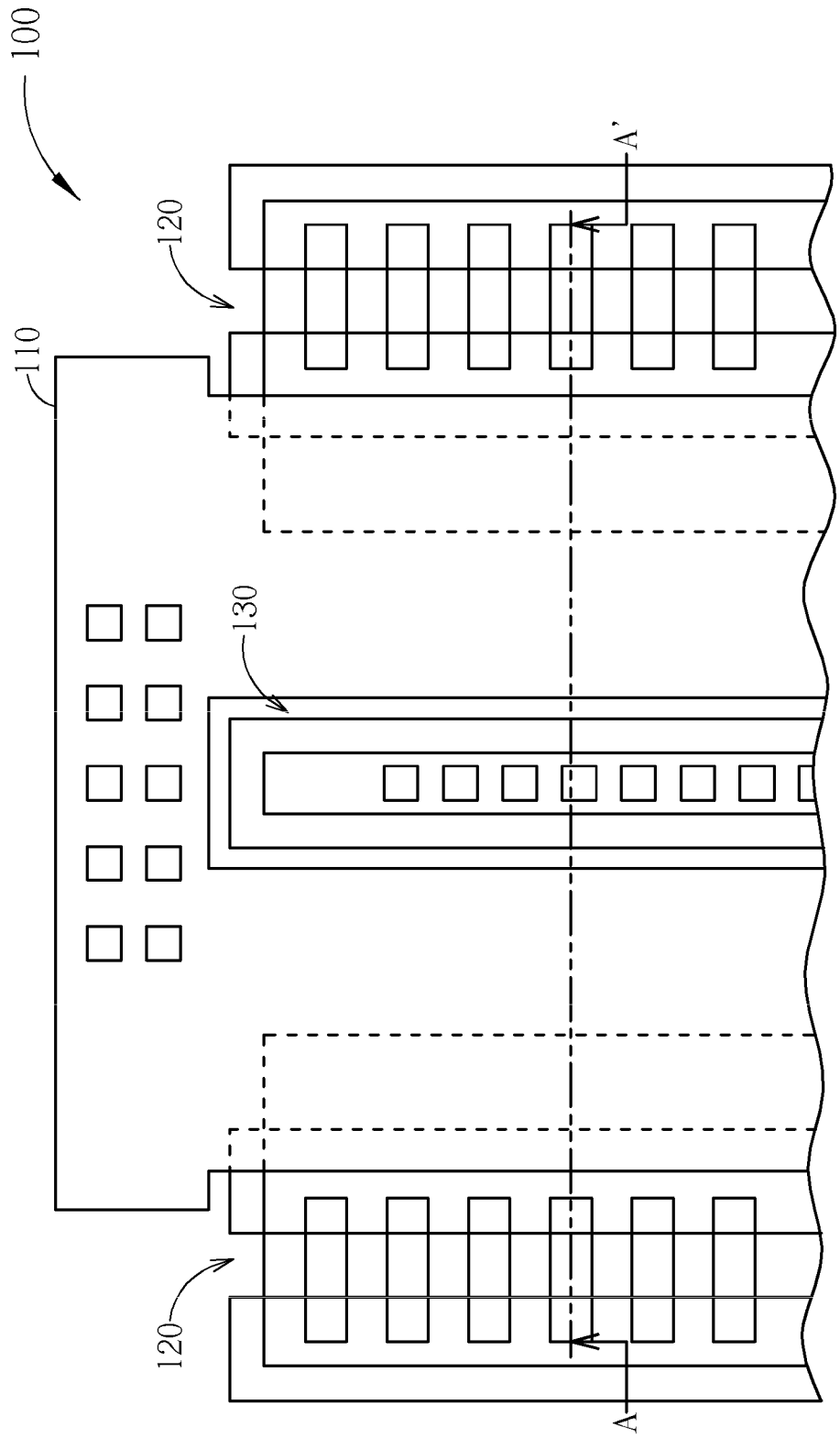
FIG. 1 is a schematic drawing illustrating a layout pattern of a conventional LDMOS transistor device.
Figure 2:
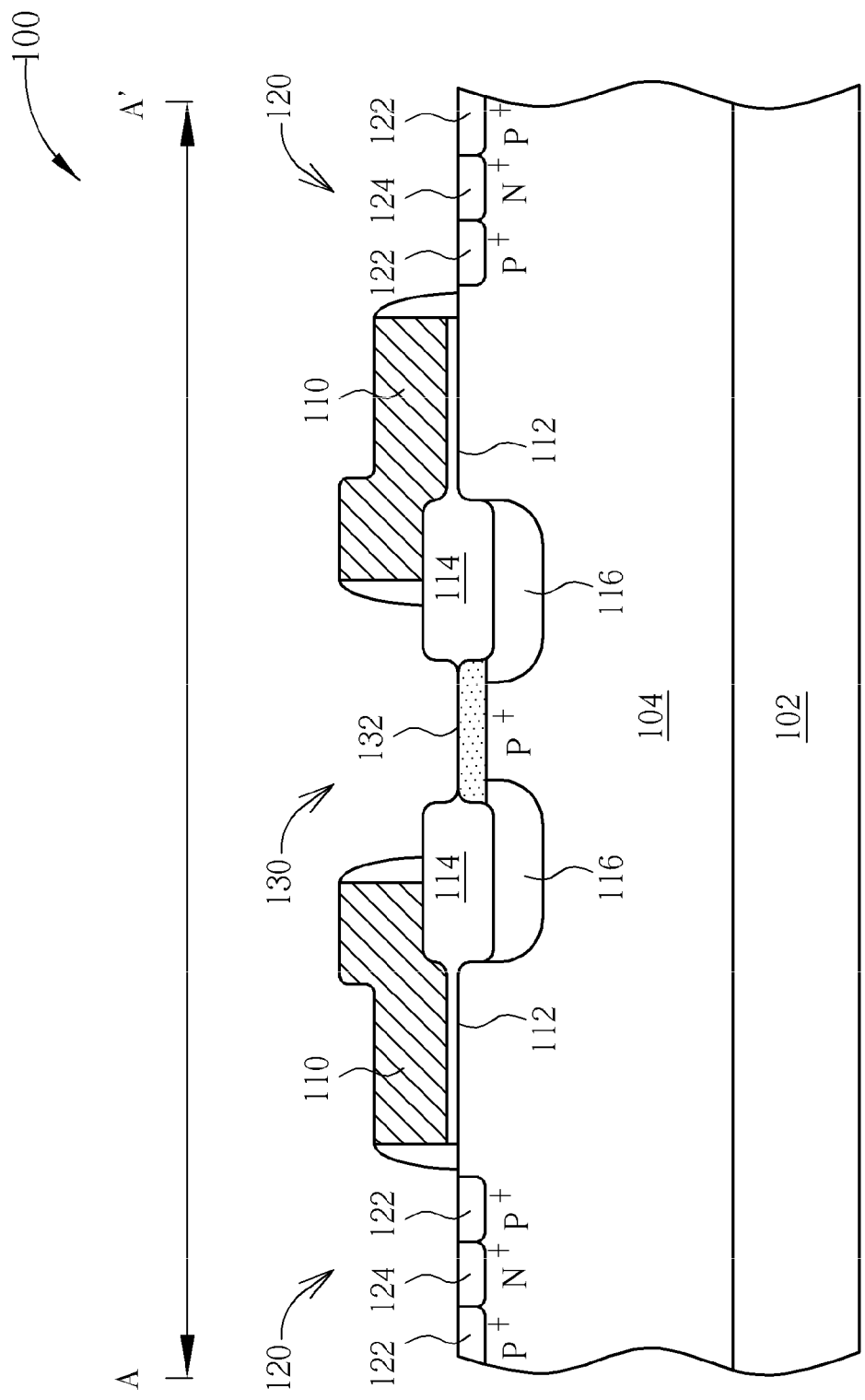
FIG. 2 is a cross-sectional view taken along a crossing line A-A' in FIG. 1.
Figure 3:
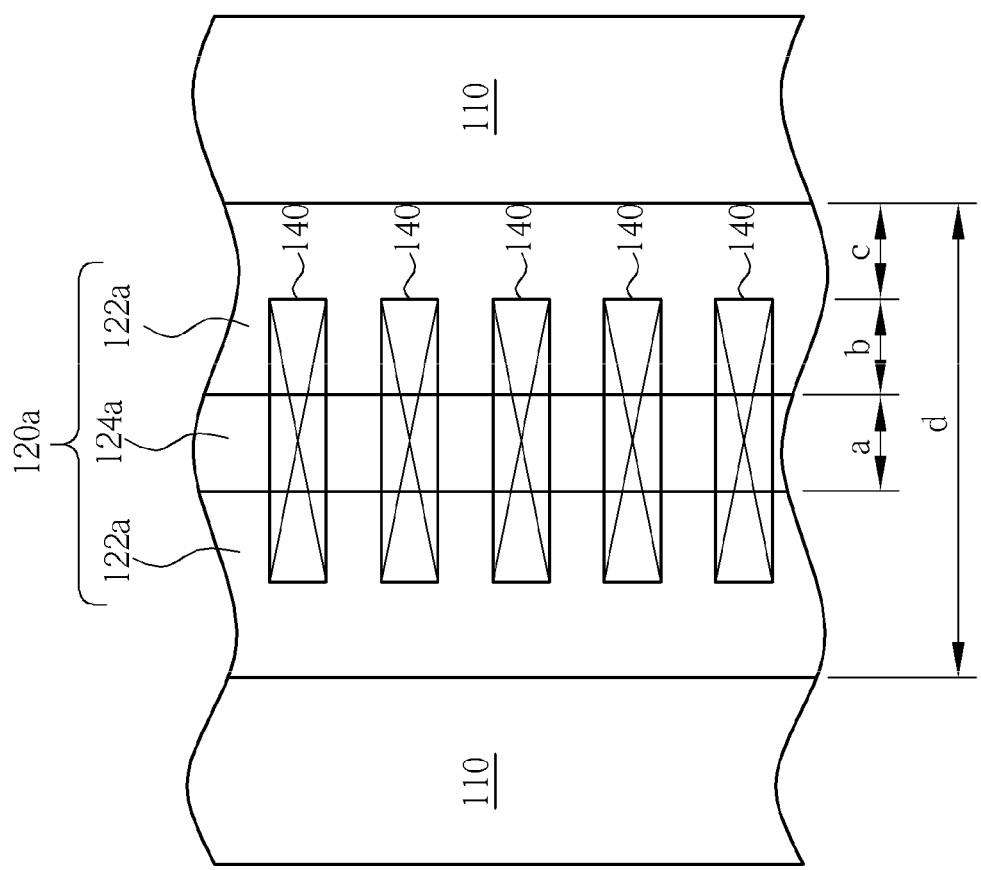
FIG. 3 is a schematic drawing illustrating a portion of a layout pattern of a conventional source.
Figure 4:
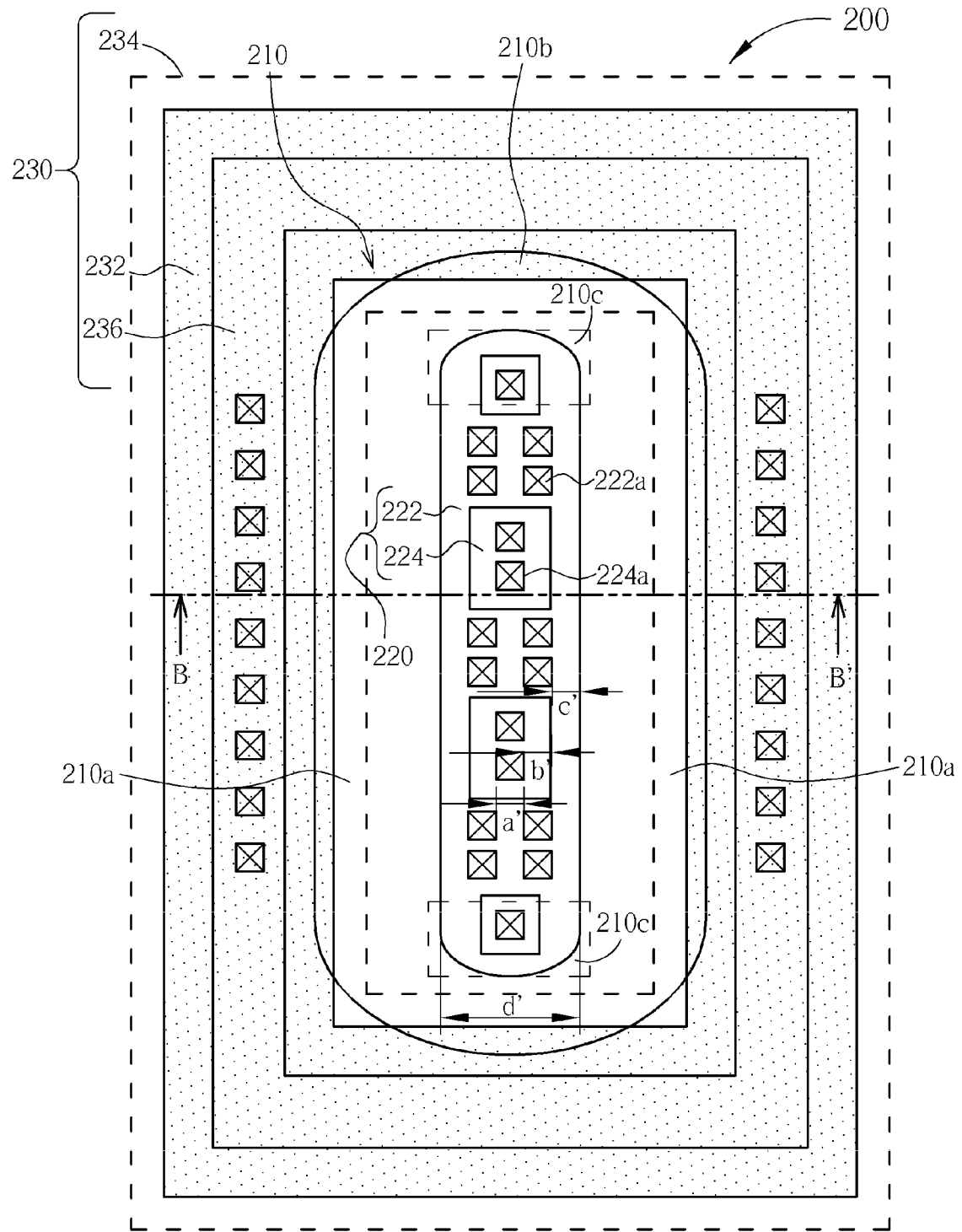
FIG. 4 is a schematic drawing illustrating a LDMOS device provided by a preferred embodiment of the present invention.
Figure 5:
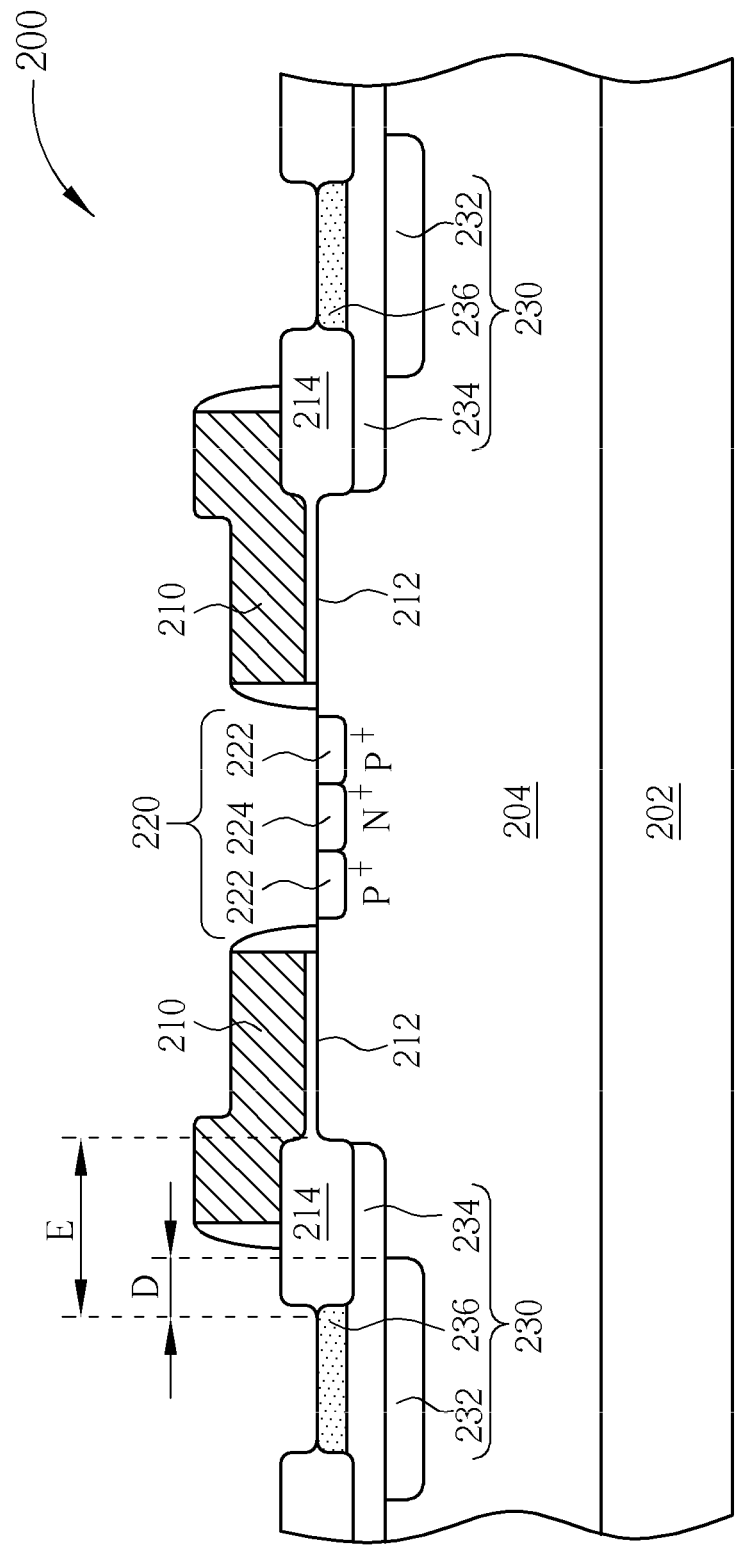
FIG. 5 is a cross-sectional view taken along a crossing line B-B' in FIG. 4.
Figure 6:
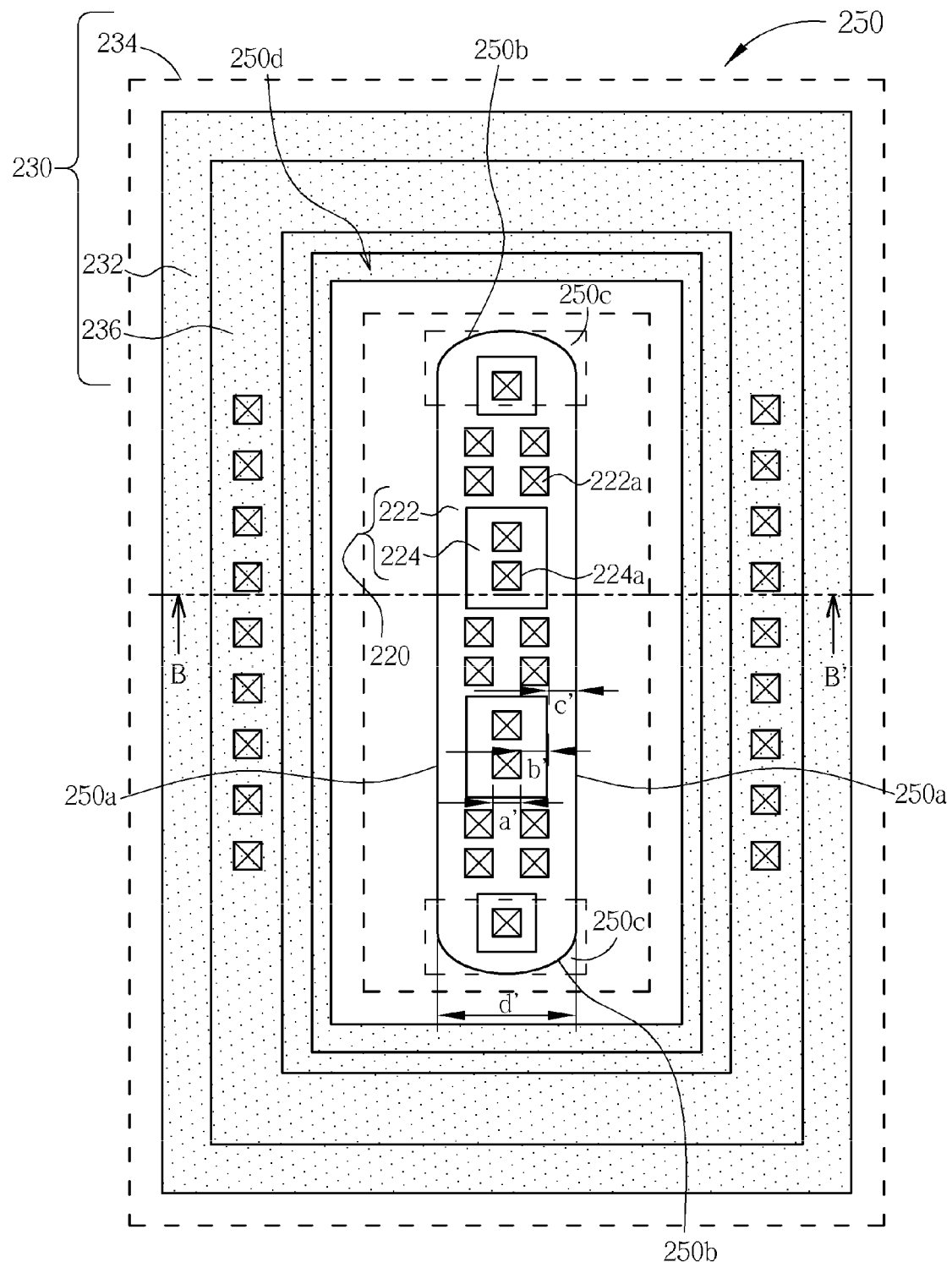
FIG. 6 is a schematic drawing illustrating a modification to the LDMOS device of the preferred embodiment.

Please refer to FIGS. 4-6, FIG. 4 is a schematic drawing illustrating a LDMOS device provided by a preferred embodiment of the present invention, FIG. 5 is a cross-sectional view taken along a crossing line B-B' in FIG. 4, and FIG. 6 is a schematic drawing illustrating a modification to the LDMOS device of the preferred embodiment. As shown in FIGS. 4-5, the LDMOS device 200 provided by the preferred embodiment includes a semiconductor substrate 202, which has a first conductive type, and a deep well region 204 having a second conductive type formed therein. In the preferred embodiment, the first conductive type is P-type and the second conductive type is N-type. However, those skilled in the art would easily realize that it is not limited to have the first conductive type being N-type and the second conductive type being P-type. Accordingly, the LDMOS device 200 provided by the preferred embodiment is a P-type LDMOS device positioned on an N-type deep well region 204 in a P-type semiconductor substrate 202.

Please refer to FIG. 4. The LDMOS device 200 provided by the preferred embodiment includes a gate 210 formed on an active region. The gate 210 has a layout pattern of a racetrack shape. As shown in FIG. 4, the gate 210 comprises a pair of liner portions 210a that parallel with each other and a pair of curved end portions 210b that respectively positioned at two ends of the liner portions 210a. However, the gate of the preferred embodiment is not limited to this. As shown in FIG. 6, a modification to the preferred embodiment provides a gate 250 has rectangular and hollow layout pattern. In detail, an outer perimeter of the gate 250 includes a rectangular outer perimeter 250d while the inner perimeter of the gate includes a pair of liner inner perimeters 250a that parallel with each other and a pair of curved inner perimeters 250b that respectively positioned at two ends of the liner inner perimeter 250a. Accordingly, the liner inner perimeters 250a and the curved inner perimeters 250b construct a racetrack perimeter.

Please refer to FIG. 4 and FIG. 6. The LDMOS device 200 further includes a source 220 and a drain 230. Different from the prior art, the LDMOS device 200 provided by the preferred embodiment employs the common source approach instead of the common drain approach. Furthermore, to prevent the breakdown voltage from being lowered due to the local concentration of the electric field near the curved end portions 210b/250b, the preferred embodiment further includes a pair of doped regions 210c/250c having the second conductive type respectively formed in the semiconductor substrate 202 at two ends of the common source 220. The doped region 210c/250c is corresponding and partially overlapping the curved end portion 210b/250b of the gate 210 and the common source 220. The doped region 210c/250c is formed to avoid the channel generated in the curved end portion 210b/250b, and thus the electric fields generated near the curved end portions 210b/250b are avoided.

As shown in FIG. 4, the gate 210 provided by the preferred embodiment has the layout pattern of racetrack shape, that is a closed pattern and the common source 220 in the semiconductor substrate 202 is enclosed by the gate 210 having the closed layout pattern. In other words, the common source 220 is surrounded by the gate 210. The common source 220 includes a first doped region 222 having a high doping concentration and a plurality of islanding second doped regions 224 respectively having a high doping concentration. The first doped region 222 has the first conductive type and the islanding second doped regions 224 have the second conductive type. The islanding second doped regions 224 are arranged parallel with the liner portions 210a and the islanding second doped regions 224 are surrounded by the first doped region 222. In other words, the islanding second doped regions 224 are electrically isolated from each other by the first doped region 222. The islanding second doped regions 224 serve as the body of the LDMOS device 200 and are used to provide grounding. As shown in FIG. 4, a plurality of body contact plugs 224a are positioned on the islanding second doped regions and a plurality of source contact plugs 222a are position on the first doped region 222 at two sides of the islanding second doped regions 224 that parallel with the liner portions 210a of the gate 210. The source contact plugs 222a are electrically connected to the first doped region 222 and the body contact plugs 224a are electrically connected to the islanding second doped regions 224. The source contact plugs 222a and the body contact plugs 224a have the same size. In the preferred embodiment, each islanding second doped region 224 preferably contains two body contact plugs 224a and the body contact plugs 224a are arranged parallel with the liner portions 210a of the gate 210. The contact plugs in the first doped region 222 are more than that in the islanding second doped region 224. For instance, each first doped region 222 contains four body contact plugs 224a according to the preferred embodiment. And the four body contact plugs 224a area arranged in a matrix. However, those skilled in the art would easily realize the numbers of the abovementioned contact plugs are only exemplarily disclosed. The numbers can be adjusted to fit the needs desired as long as the number of the source contact plugs 222a is larger than the number of the body contact plugs 224a.

It is noteworthy that when designing the layout pattern, a width "a" of the source contact plugs 222a and the body contact plugs 224a, a distance "b" between the islanding second doped region 224 and the body contact plug 224a, and a distance "c" between the islanding second doped region 224 and the gate 210 are always put in serious consideration. As shown in FIG. 4, a distance "d" between the parallel liner portions 210a of the gate 210 is a sum of the width "a" of the body contact plugs 224a, the distance "2b" between both sides of the body contact plugs 224a and the islanding second doped region 224, and the distance "2c" between both sides of the islanding second doped region 224 and the gate 210. More important, according to the layout pattern of the first doped region 222 and the islanding second doped regions 224 provided by the present invention, the width "a" of the source contact plugs 222a and the body contact plugs 224a, the distance "b" between the islanding second doped region 224 and the body contact plugs 224a, and the distance "c" between the islanding second doped region 224 and the gate 210 are able to be further reduced. For example, in the process window, the width "a" of the source contact plugs 222a and the body contact plugs 224a is 0.34 μm, the distance between the islanding second doped region 224 and the body contact plugs 224a is 0.2 μm, and the distance "c" between the islanding second doped region 224 and the gate 210 is 0.4 μm. Therefore, the distance "d" between the parallel two liner portions of the gate 210 is about 1.54 μm. Compared with the distance "d" between the liner portions of the conventional gate, 30% of the distance "d" between the parallel liner portions 210a of the gate 210 is reduced according to the preferred embodiment. In simplicity, by providing the islanding second doped regions with this featured optimal layout pattern, the distance "d" between the gate 210a is reduced. Consequently, the cell pitch of the LDMOS device 200 is reduced and thus Ron is effectively reduced according to the preferred embodiment.

Please still refer to FIGS. 4-5. According to the preferred embodiment, the gate 210 of the LDMOS device 200 is positioned on a gate dielectric layer 212 and extends to a field oxide (FOX) layer 214, and thus covers a portion of the FOX layer 214. The FOX layer 214 is formed by a local oxidation of silicon (LOCOS) method and includes a length "E". It is well-known that the length "E" of the FOX layer 214 is adjustable according to the operating voltage of the LDMOS device 200. For example, the length "E" can be 0.8 μm when the LDMOS device 200 is a HV device having the operating voltage of 24V, the length "E" can be 1.2 μm when the LDMOS device 200 has the operating voltage of 30V, the length "E" can be 1.6 μm when the LDMOS device 200 has the operating voltage of 40V, and the length "E" can be 4 μm when the LDMOS device 200 has the operating voltage of 60V.

Furthermore, the drain 230 of the LDMOS device 200 is formed in the semiconductor substrate 202 surrounding the gate 210. In other words, the gate 210 having the closed layout pattern of racetrack shape is enclosed by the drain 230. Because the high voltage is applied to the drain 230 of the LDMOS device 200, the electric fields near the drain 230 always seriously affect the breakdown voltage of the LDMOS device 200. Accordingly, the drain 230 is positioned surrounding the gate 210 according to the preferred embodiment, therefore smooth electric fields are obtained and thus the breakdown voltage is improved. The drain 230 includes a third doped region 232 having the first conductive type and ring shape. In the preferred embodiment, the third doped region 232 is first formed in the deep well region 204 of the semiconductor substrate 202 and followed by performing the LOCOS method to form the FOX layer 214. Then, a drift region 234 in ring shape having the first conductive type is formed on the third doped region 232. It is noteworthy that a doping concentration of the third doped region 232 is higher than a doping concentration of the drift region 234. More important, a profile of the drift region 234 laterally extends to the bottom of the FOX layer 214 and encompasses the bottom of the FOX layer 214. As shown in FIG. 5, the drift region 234 at least completely overlaps the FOX layer 214. A profile of the third doped region 232 also laterally extends to the bottom of the FOX layer 214, however, the third doped region 232 positioned under the drift region 234 only overlaps a portion of the FOX layer 214. Thus an overlapping area between the FOX layer 214 and the third doped region 232 is obtained, and the overlapping area has a length "D". After forming the drift region 234, a fourth doped region 236 having a high doping concentration is formed in ring shape in the drift region 234, and the fourth doped region 236 also has the first conductive type. In the preferred embodiment, the doping concentration of the fourth doped region 236 is higher than the doping concentration of the third doped region 232, and the doping concentration of the third doped region 232 is higher than the doping concentration of the drift region 234. In addition, since the ion implantations and drive-in processes are all well-known to those skilled in the art, the details are omitted here in the interest of brevity.

In the preferred embodiment, the drift region 234 of the drain 230 and the first doped region 222 of the common source 220 are taken as in serial connection, therefore Ron is reduced. The length "D" of the overlapping area between the third doped region 232 and the FOX layer 214 is adjustable according to the operating voltage of the LDMOS device 200. In the case that the length "D" of the overlapping area is excessively short, a fully depleted region between the drift region 234 and the deep well region 204 having the second conductive type becomes larger, such that the breakdown voltage of the LDMOS device 200 is reduced. In the case that the length "D" of the overlapping area is excessively long, a punch-through effect is caused between the third doped region 232 and the first doped region 222, such that the breakdown voltage is also reduced. It is conceivable that the breakdown voltage of the LDMOS device 200 is susceptible to the length "D" of the overlapping area. According to the preferred embodiment, when the LDMOS device 200 is a HV device having the operating voltage lower than 60V, the length "D" of the overlapping area can be 0.2 μm; and when the LDMOS device 200 is a HV device having the operating voltage higher than 60V, the length "D" of the overlapping area can be 2 μm.

According to the LDMOS transistor device 200 provided by the preferred embodiment, the islanding second doped regions 224 of the common source 220 that having the featured optimal layout pattern are provided to reduce the cell pitch of the LDMOS device 200, thus Ron is consequently reduced. The drain 230 of the present invention is provided to surround the gate 210 thus smooth electric fields are obtained. Furthermore, the drift region 234 of the drain 210 is provided to reduce Ron, and the third doped region 232 is provided to improve the breakdown voltage. Accordingly, a cell pitch of the LDMOS device 200 having operating voltage of 40V is reduced to 8.58 μm, the breakdown voltage is improved to 52V, and Ron is substantially reduced to 106 mΩ/mm$^2$.

According to the LDMOS transistor device, the common source having the optimal layout pattern is provided to reduce the cell pitch and the doped regions of the drain that provided surrounding the gate are used to reduce Ron and improve the breakdown voltage. More important, when the prior art LDMOS device still faces the trade-off issue between the improvement of the breakdown voltage and the reduction of Ron, the LDMOS device provided by the present invention benefits an improvement of 5% to the breakdown voltage and simultaneously an reduction of 40% to Ron.

Those skilled in the art will readily observe that numerous modifications and alterations of the device and method may be made while retaining the teachings of the invention.

What is claimed is:

1. A lateral-diffusion metal-oxide-semiconductor (LDMOS) device comprising:
   a semiconductor substrate having at least a field oxide layer formed thereon;
   a gate positioned on the semiconductor substrate and covering a portion of the field oxide layer, the gate having a layout pattern of a racetrack shape and further comprising a pair of liner portions parallel with each other and a pair of curved end portions respectively positioned at two ends of the liner portions;

a drain surrounding the gate formed in the semiconductor substrate; and a common source formed in the semiconductor substrate and enclosed by the gate, the common source comprising a first doped region having a first conductive type and a plurality of islanding second doped regions having a second conductive type, a number of the islanding second doped regions is larger than a number of the first doped region.

2. The LDMOS device of claim 1, wherein the islanding second doped regions are electrically isolated from each other by the first doped region.

3. The LDMOS device of claim 1, further comprising a plurality of source contact plugs electrically connected to the first doped region and a plurality of body contact plugs electrically connected to the islanding second doped regions.

4. The LDMOS device of claim 3, wherein a number of the source contact plugs is larger than a number of the body contact plugs.

5. The LDMOS device of claim 1, wherein the drain surrounding the gate further comprises:
 a drift region formed in the semiconductor substrate, the drift region completely overlaps to the field oxide layer and encompasses a bottom of the field oxide layer;
 a third doped region formed under the drift region, the third doped region overlaps a portion of the field oxide layer; and
 a fourth doped region formed in the drift region.

6. The LDMOS device of claim 5, wherein the drift region, the third doped region and the fourth doped region comprise the first conductive type.

7. The LDMOS device of claim 6, wherein a doping concentration of the fourth doped region is higher than a doping concentration of the third doped region, and the doping concentration of the third doped region is higher than a doping concentration of the drift region.

8. The LDMOS device of claim 1, wherein the gate further comprises a pair of fifth doped regions having the second conductive type formed in the semiconductor substrate, the fifth doped regions respectively corresponds and partially overlaps to the curved end portion of the gate.

9. The LDMOS device of claim 1, wherein the first conductive type is P-type and the second conductive type is N-type.

10. The LDMOS device of claim 1, wherein the plurality of islanding second doped regions are entirely disposed in the first doped region.

11. A lateral-diffusion metal-oxide-semiconductor (LDMOS) device comprising:
 a semiconductor substrate having a deep well region of a first conductive type formed therein and a field oxide layer formed thereon;
 a gate positioned on the semiconductor substrate and overlapping a portion of the field oxide layer, the gate having a layout pattern of a racetrack shape;
 a drain surrounding the gate and formed in the deep well region in the semiconductor substrate, the drain comprising:
  a first doped region having a second conductive type and overlapping a portion of the field oxide layer and an overlapping area smaller than the filed oxide layer being formed therebetween;
  a drift region formed on the first doped region in the semiconductor substrate, the drift region completely overlaps the field oxide layer and encompasses a bottom of the field oxide layer; and
  a second doped region formed in the drift region; and
 a common source formed in the semiconductor substrate and enclosed by the gate.

12. The LDMOS device of claim 11, wherein the first doped region, the drift region and the second doped region comprises the second conductive type.

13. The LDMOS device of claim 12, wherein a doping concentration of the second doped region is higher than a doping concentration of the first doped region, and the doping concentration of the first doped region is higher than a doping concentration of the drift region.

14. The LDMOS device of claim 11, wherein when an operating voltage of the LDMOS device is lower than 60 Volt (V), a length of the overlapping area between the first doped region and the field oxide layer is equal to 0.2 µm.

15. The LDMOS device of claim 11, wherein when an operating voltage of the LDMOS device is higher than 60 (V), a length of the overlapping area between the first doped region and the field oxide layer is equal to 2 µm.

16. The LDMOS device of claim 11, wherein the common source further comprises
 a third doped region having the second conductive type; and
 a plurality of islanding fourth doped regions having the first conductive type.

17. The LDMOS device of claim 11, wherein the gate further comprises:
 a pair of liner portions parallel with each other; and
 a pair of curved end portions respectively positioned at two ends of the liner portions.

18. The LDMOS device of claim 17, wherein the gate further comprises a pair of fifth doped regions having the first conductive type formed in the semiconductor substrate, the fifth doped regions respectively corresponds and partially overlaps to the curved end portion of the gate.

19. The LDMOS device of claim 11, wherein the first conductive type is N-type and the second conductive type is P-type.

* * * * *